United States Patent [19]

Pfizenmayer

[11] Patent Number: 5,650,920

[45] Date of Patent: Jul. 22, 1997

[54] MOUNT FOR SUPPORTING A HIGH FREQUENCY TRANSFORMER IN A HYBRID MODULE

[75] Inventor: Henry L. Pfizenmayer, Phoenix, Ariz.

[73] Assignee: Motorola, Inc., Schaumburg, Ill.

[21] Appl. No.: 508,282

[22] Filed: Jul. 27, 1995

[51] Int. Cl.$^6$ .............................. H05K 7/02; H01F 5/02; H01F 27/30

[52] U.S. Cl. ................ 361/782; 361/811; 361/760; 336/200; 336/208

[58] Field of Search ................... 174/166 S, 138 G; 257/686, 723, 724, 924; 333/172, 177, 178, 181, 183, 185; 336/82, 83, 87, 90, 92, 68, 195, 196, 199, 200, 208; 361/767, 770, 771, 782, 807, 808, 809, 811, 812, 821, 825

[56] References Cited

U.S. PATENT DOCUMENTS

| | | |
|---|---|---|
| 5,212,345 | 5/1993 | Gutierrez . |
| 5,386,343 | 1/1995 | Pao . |

FOREIGN PATENT DOCUMENTS

| | | | |
|---|---|---|---|
| 0406829 | 1/1991 | European Pat. Off. . | |
| 0501850 | 9/1992 | European Pat. Off. . | |
| 3730325 | 3/1989 | Germany ........................... 361/782 |
| 9313131 | 12/1993 | Germany . | |
| 62-260353 | 11/1987 | Japan .......................... 257/686 |
| 2-146792 | 6/1990 | Japan .......................... 439/78 |

OTHER PUBLICATIONS

Harold Winard, Electronic Design, "Surface Mounting Pushes New Designs in Chip Inductors", Mar. 13, 1986, vol. 34, No. 6, pp. 41–46.

TOKO America, Inc., "Coils and Filters", 1994, pp. 136–137.

Plasmetex Industries, Inc., "Component Mounting Hardware", 1993, pp. 1,2,3, and 5.

IBM Technical Disclosure Bulletin "Dual–in–line Package Socket Piggyback Structure" by D.J. McAtee vol. No. 4 Sep. 1973.

*Primary Examiner*—Donald Sparks
*Attorney, Agent, or Firm*—Joe E. Barbee; George C. Chen

[57] ABSTRACT

A transformer mount (11) supports a transformer (12) over a component (22) on a substrate (23) of a hybrid module (10). The transformer mount (11) conserves space in the hybrid module (10), improves high frequency performance by minimizing parasitic capacitances and inductances of the transformer mount (11), is compatible with subsequent high temperature and batch processing for faster assembly, permits the flow of defluxing materials beneath the transformer mount (11), is inexpensive, and provides appropriate access to fine tune the transformer (12) during assembly.

14 Claims, 2 Drawing Sheets

5,650,920

MOUNT FOR SUPPORTING A HIGH FREQUENCY TRANSFORMER IN A HYBRID MODULE

BACKGROUND OF THE INVENTION

This invention relates, in general, to a mounting device, and more particularly, to a transformer mount for supporting a transformer on a substrate.

Many high frequency transformer mounts utilize surface mount technology which does not permit the free flow of defluxing fluids underneath the transformer mounts. As a result, with reflow processes, there will be fluxing residues left in place which restrict the use of the substrate area under the transformer mount, especially for thin film resistors and closely spaced conductors at different potentials. Therefore, techniques such as reflow processes cannot be used in assembling the transformer mounts. Furthermore, many transformer mounts cannot withstand the furnace temperatures associated with reflow operations. Consequently, a manually labor intensive process is often used to attach transformer mounts to a substrate.

Other labor intensive processes associated with transformer assembly include stripping and tinning of the transformer wires to couple the transformer to the transformer mount. These processes also remain manual operations due to the inability of the transformer mounts to withstand the automated and batch processing of the stripping and tinning steps.

Conventional transformer mounts which are surface mount devices do not permit the positioning of a separate component underneath the transformer mount and between the transformer mount and the substrate. By providing a transformer mount capable of being mounted over a separate component and mounted to the same substrate as the separate component, the overall size of hybrid modules can be reduced.

Additionally, other transformer mounts, whether surface mount devices or not, often do not provide access to the transformer windings to allow for slight adjustments or a fine tuning of the high frequency transformer either during manufacture of the high frequency transformer or during assembly of the hybrid circuit utilizing the high frequency transformer.

Accordingly, a need exists for a transformer mount which permits the free flow of defluxing fluids beneath the transformer mount for automated assembly, is capable of withstanding the high temperature operations of stripping, tinning, and soldering, permits the mounting of at least one separate component underneath the transformer mount, and provides access to the transformer windings during manufacture and assembly. In complying with the above listed requirements, the transformer mount should minimize parasitic inductance and capacitance for optimal high frequency performance and should not be expensive.

DETAILED DESCRIPTION OF THE DRAWINGS

Figure 1:
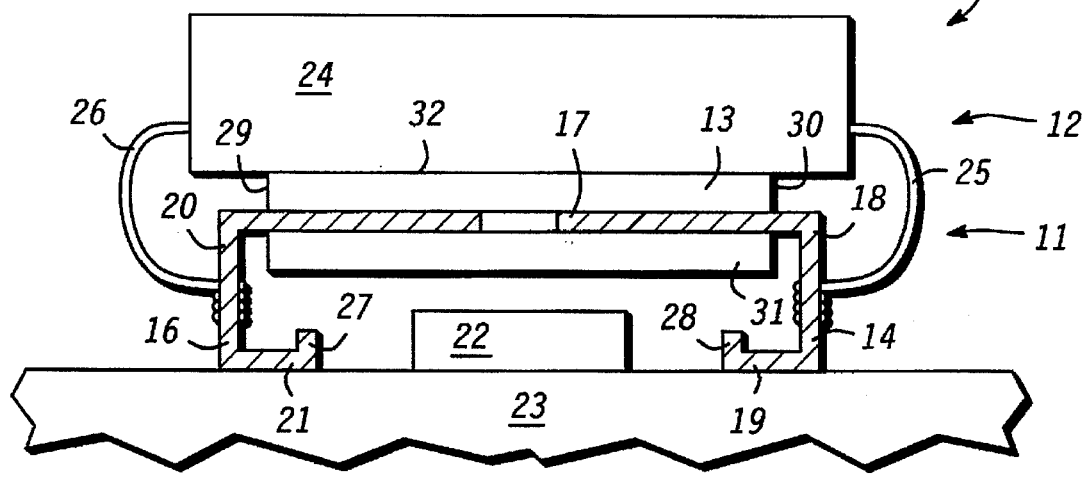
FIG. 1 illustrates a cross-sectional view of a deployment of a transformer mount in accordance with the present invention.

Turning to the figures for a more detailed description of the subject invention, FIG. 1 illustrates a cross-sectional view of a transformer mount in accordance with the present invention. Hybrid module or high frequency hybrid module 10 comprises a mounting device, transformer mount, or mount 11 and a transformer or high frequency transformer 12. Hybrid module 10 is mounted on a substrate 23 and is mounted over a component 22. Substrate 23 is any substrate used in the art of hybrid rf (radio frequency) modules or electronics, and component 22 is at least one component or chip used in the art of electronics such as a discrete or semiconductor resistor, capacitor, inductor, semiconductor integrated circuit, or the like. Substrate 23 can also contain or component 22 can also be closely spaced conductors at different potentials as well as thin film resistors.

High frequency transformer or transformer 12 is represented by a block 24 and leads or wires 25 and 26. Block 24 represents a conventional transformer as known in the art including, but not limited to, copper alloy wires wrapped around a ferromagnetic substrate. Wires 25 and 26 of transformer 12 couple transformer 12 to transformer mount 11 as shown in FIG. 1 and as described in more detail below.

Mount or transformer mount 11 has a base plate 13 and plurality of leads 14 and 16. Base plate 13 has a surface 32 for supporting transformer 12 and a surface 31 opposite surface 32 and facing component 22 and substrate 23. Side surfaces 29 and 30 of base plate 13 couple surfaces 31 and 32 of base plate 13. Base plate 13 can comprise an electrically insulating material such as epoxy used in semiconductor molded packages, a liquid crystal polymer, a ceramic, or the like. However, base plate 13 preferably comprises diallyl phthalate or other electrically insulating materials having a high melting point or a high dimensional deformation point temperature in order for base plate 13 to be able to withstand high temperature process steps such as a 400° C. solder dip. Having a dielectric constant between approximately 4.5 and 5.0, diallyl phthalate is preferred due to its dielectric constant being about a factor of two lower than conventional ceramics typically used for transformer mounts. Having a lower dielectric constant improves high frequency performance by reducing the parasitic inter-electrode or inter-lead capacitance of transformer mount 11.

Leads 14 and 16 of base plate 13 comprise electrically conductive materials such as those used in conventional semiconductor leadframes or the like. In fact, as depicted in FIG. 1, leads 14 and 16 can be part of leadframe 17 which provides electrical isolation between leads 14 and 16. Leadframe 17 is partially encapsulated with the electrically insulating material that forms base plate 13 of transformer mount 11. End 18 of lead 14 extends from side surface 30 or base plate 13, and end 19 of lead 14 is bent underneath surface 31 of base plate 13 and is mounted or attached to substrate 23. Similarly, end 20 of lead 16 extends from side surface 29, and end 21 of lead 16 is bent underneath base plate 13 and mounted on substrate 23. Portions 27 and 28 of leads 16 and 14, respectively, can be further bent upwards as shown in FIG. 1. Wires 25 and 26 are wrapped around leads 14 and 16, respectively, to electrically couple transformer 12 to substrate 23.

Ends 19 and 21 are bent towards leads 16 and 14, respectively, and beneath base plate 13 to conserve space on substrate 23. If ends 19 and 21 were bent away from leads 16 and 14, respectively, transformer mount 11 would require a larger footprint on substrate 23, and as a result, hybrid module 10 would have to be a larger size. By bending leads 16 and 14 underneath base plate 13 in accordance with the present invention, transformer mount 11 has a smaller footprint to reduce the size of hybrid module 10.

Furthermore, leads 14 and 16 are of a predetermined length to support base plate 13 at a desired height above substrate 23 so that transformer mount 11 can be mounted over component 22 as depicted in FIG. 1. In doing so, additional space is conserved on substrate 23 and in hybrid module 10.

A method of fabricating hybrid module 10 is described below. First, transformer 12 is assembled by, for example, winding wires 25 and 26 around a ferromagnetic core to form block 24. Then, block 24 is attached to surface 32 of base plate 13, and wires 25 and 26 are wrapped around leads 14 and 16, respectively. Wires 25 and 26 have a thermally removable electrically insulating coating. Along with attached transformer mount 11, at least a portion of the external wires or leads of transformer 12 is dipped into or immersed in a heated solder pot. This solder dip process and other similar techniques such as a solder wave process thermally strips the electrically insulating coating from wires 25 and 26, tins wires 25 and 26, and solders wires 25 and 26 to leads 14 and 16, respectively. Leads 14 and 16 are then trimmed, and transformer mount 11 along with transformer 12 are placed in a tape and reel for a pick and place operation. Thus the stripping, tinning, and soldering operations are no longer tediously labor intensive processes but rather are a batched and automated process.

Component 22, transformer mount 11, and other components of hybrid module 10 are positioned on substrate 23, and a heat sink, if desired, is screened under substrate 23. A reflow process is then used to attach all components of hybrid module 10 in a single one to five minute reflow step. The time saving reflow process can be used with the transformer mount of the present invention because base plate 13 comprises a material having a melting temperature greater than that used during the reflow step. Finally, a deflux process is used to remove the excess solder or flux to prevent the existence of flux remnants under the transformer and elsewhere on substrate 23 which may inadvertently short hybrid module components including, but not limited to, conductors of different potentials and thin film resistors. The lead configuration of transformer mount 11 permits the flow of defluxing fluid underneath transformer mount 11.

Figure 2:
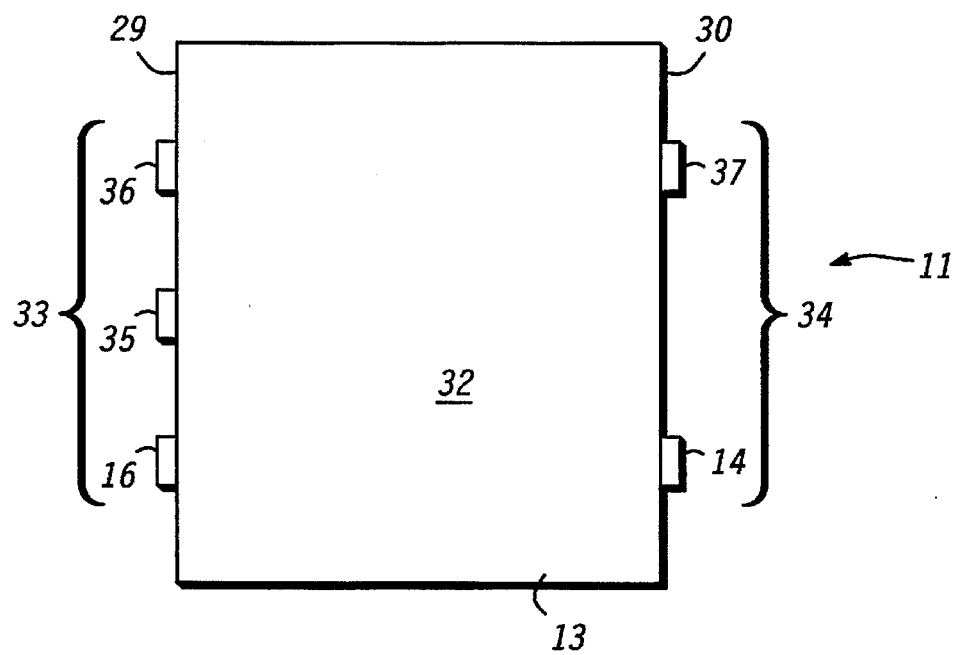
FIG. 2 represents a top view of a transformer mount in accordance with the present invention.

Turning now to the next figure, FIG. 2 represents a top view of transformer mount 11 in accordance with the present invention. Transformer mount 11 is not shown with a transformer mounted on surface 32 of base plate 13. A plurality of leads 33 and 34 extend from base plate 13. In particular, a set of leads 33 protrudes from side surface 29 and another set of leads 34 protrudes from side surface 30. The set of leads 33 comprises leads 16, 35, and 36 while the set of leads 34 comprises leads 14 and 37. Plurality of leads 33 and 34 should be configured such that defluxing fluids can flow between plurality of leads 33 and 34 and underneath base plate 13. In this manner, as described previously, excess flux can be removed from hybrid module 10, and therefore, the excess flux residues will not be present around component 22, plurality of leads 33 and 34, and other components of hybrid module 10. Depending upon a desired configuration, two, three, four, or more leads may extend from a side surface of base plate 13. Unlike FIG. 2, the same number of leads are typically used on opposite sides of the base plate.

Figure 3:
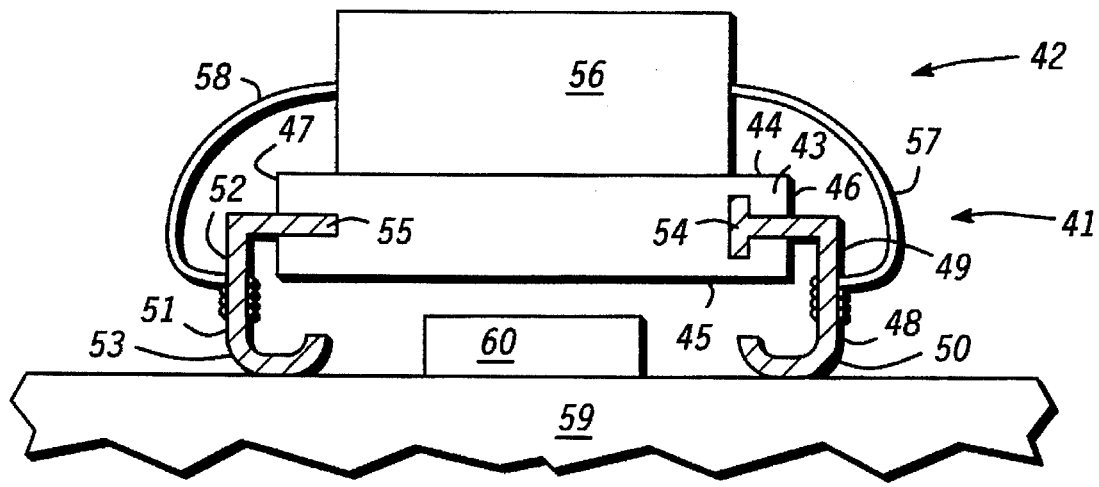
FIG. 3 depicts a cross-sectional view of an alternative embodiment of an utilization of a transformer mount.

FIG. 3 depicts a cross-sectional view of an alternative embodiment of a utilization of a transformer mount in accordance with the present invention. FIG. 3 comprises a transformer 42 mounted on a mounting device or transformer mount 41 which is, in turn, mounted over a component 60 and on a substrate 59 of a hybrid module 40. Component 60 and substrate 59 are similar to component 22 and substrate 23, respectively, of FIG. 1. Similar to transformer 12, transformer 42 comprises a block 56 and wires 58 and 57. Block 56 represents at least one transformer.

Transformer mount 41 has leads 48 and 51 protruding from sides 46 and 47, respectively, of substrate or base plate 43. Base plate 43 also has surface 44 for supporting transformer 42 and surface 45 which is opposite surface 44 and connected to surface 44 by sides 46 and 47. Base plate 43 consists of similar materials as described for base plate 13 of FIG. 1. Lead 51 of FIG. 3 has end 49 which extends from side 46 and has end 53 which is bent toward lead 48 and under surface 45 of base plate 43 and mounted on substrate 59. Likewise, lead 48 has end 52 which extends from side 47 and has end 50 which is bent toward lead 51 and under surface 45 of base plate 43 and is also mounted on substrate 59.

Note that ends 50 and 53 of FIG. 3 are bent differently from ends 19 and 21 of FIG. 1. Ends 50 and 53 are more rounded compared to ends 19 and 21 to allow for easier inspection of the joining between substrate 59 and leads 48 and 51. As an example of another difference between the leads of FIG. 1 and FIG. 2, leads 16 and 14 of FIG. 1 are part of a single leadframe or leadframe 17 while in FIG. 3, leads 51 and 48 are parts of different leadframes. Furthermore, end 49 of lead 48 can be shaped to have a larger tip as shown at portion 54 compared to portion 55 of lead 51. Portion 54 aids in keeping lead 48 firmly attached to base plate 43.

It is important to note that a transformer mount of the present invention permits a transformer which is wider than or narrower than the transformer mount to be mounted on the transformer mount as shown in FIGS. 1 and 3. In this manner, a particular size of a transformer mount can be used with many different sizes of transformers.

It is also important to note that leads 14 and 16 of FIG. 1 and leads 48 and 51 of FIG. 3 are configured such that wires 25 and 26 of FIG. 1 and wires 57 and 58 of FIG. 3 are wrapped around the aforementioned leads to electrically couple a transformer through the leads of a transformer mount to a substrate. In this manner, transformers 12 and 42 can be adjusted or fine tuned during assembly of transformers 12 and 42 to transformer mounts 11 and 41, respectively, and during assembly of hybrid modules 10 and 40, respectively. Moreover, the present invention's attachment of transformer wires to leads of a transformer mount improves high frequency performance by decreasing the parasitic inductance of many conventional transformer mounts. This reduction in parasitic inductance is accomplished by minimizing the distance of the electrical path through the transformer mount leads between the transformer wires and the substrate.

The leads of transformer mount 41 may protrude through surface 44 of base plate 43, and wires 57 and 58 may be wrapped around the protruding portions of the leads. However, at least two disadvantages arise from such a configuration. First, parasitic lead inductance is increased since the electrical path between the transformer wire to the substrate is lengthened, and second, the base plate must be now be larger than the transformer which limits or restricts the transformer mount to be used for certain sizes of transformers. Other similar modifications of leads 48 and 51 can produce similar detrimental drawbacks.

It is within the scope of the present invention to mold base plate 43 and leads 48 and 51 out of similar electrically insulating materials as described for base plate 13 of FIG. 1. Alternatively, base plate 43 and leads 48 and 51 of FIG. 3 can be punched or cut out of a block of electrically insulating material. The embodiments of base plate 13 and leads 14 and 16 of FIG. 1 can also be molded or cut out of a block of electrically insulating material. If leads 48 and 51 of FIG. 3 are electrically nonconductive, wires 57 and 58 are electrically connected directly to substrate 59 by wrapping wires 57 and 58 around end 50 of lead 48 and end 53 of lead 51, respectively. End 50 of lead 48 can be shaped to contain a notch to facilitate the positioning of wire 57 wrapped around end 50 of lead 48.

Figure 4:
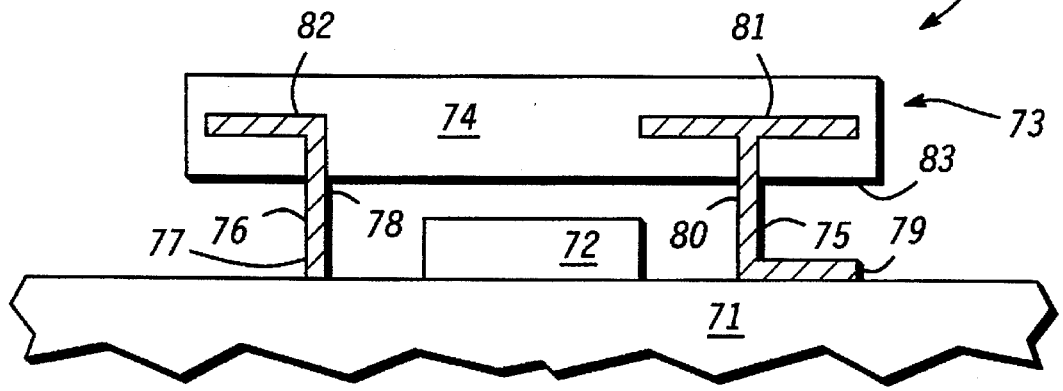
FIG. 4 illustrates a cross-sectional view of an additional embodiment of a deployment of a transformer mount.

Turning to yet another variation of the present invention, FIG. 4 illustrates a cross-sectional view of an additional embodiment of a deployment of a transformer mount in accordance with the present invention. A module 70 comprises a transformer mount or mounting device 73 over at least one component 72 and attached to a substrate 71. At least one component 72 and substrate 71 are similar to component 22 and substrate 23 of FIG. 1.

Mounting device 73 of FIG. 4 comprises a substrate or base plate 74 which is similar in composition to base plate 13 of FIG. 1. However, mounting device 73 has ends 80 and 78 of leads 75 and 76, respectively, extending from bottom surface 83 of base plate 74. Ends 77 and 79 show variations of the mounting ends of leads 76 and 75, respectively, which are within the scope of the present invention. End 79 is bent underneath bottom surface 83 and away from lead 76 but does not make the footprint of mounting device 73 larger than base plate 74. Portions 81 and 82 illustrates different embodiments to help keep leads 75 and 76, respectively, firmly attached to base plate 74.

It is within the scope of the present invention to apply the concept of mounting a transformer mount on a substrate and over another component to mount a packaged semiconductor device on a substrate and over another component. The leads of the packaged semiconductor device should be configured such that leads of the packaged semiconductor device do not significantly enlarge the footprint of the packaged semiconductor device beyond that of the packaging material.

Therefore, in accordance with the present invention, it is apparent there has been provided an improved transformer mount which overcomes the disadvantages of the prior art. The present invention conserves space in a hybrid module, improves high frequency performance by minimizing parasitic capacitances and inductances of the transformer mount, is compatible with subsequent high temperature and batch processing for faster assembly, permits the flow of defluxing materials beneath the transformer mount, is inexpensive, and provides appropriate access to fine tune the transformer during assembly.

I claim:

1. A mount for supporting a high frequency transformer over a component on a substrate in a hybrid module, the mount comprising:

a base plate having a first surface, a second surface opposite the first surface and facing the substrate, the first surface supporting the high frequency transformer; and a plurality of leads extending from the base plate and bent underneath the second surface of the base plate, the plurality of leads mounted on the substrate to support the base plate over the component, the transformer electrically coupled to a portion of one of the plurality of leads, the portion of the one of the plurality of leads non-contiguous with the first surface of the base plate and devoid of encapsulation by the base plate.

2. The mount according to claim 1, further including:

a first side surface of the base plate coupling the first surface and the second surface;

a second side surface of the base plate coupling the first surface and the second surface; and a first set of leads and a second set of leads forming the plurality of leads, the first set of leads having first ends extending from the first side surface and having second ends bent underneath the second surface of the base plate and mounted on the substrate, the second set of leads having third ends extending from the second side surface and having fourth ends bent underneath the second surface of the base plate and mounted on the substrate, wherein the second ends of the first set of leads are bent toward the second set of leads, and wherein the fourth ends of the second set of leads are bent toward the first set of leads.

3. The mount according to claim 2, wherein the base plate along with the plurality of leads comprises an electrically insulating material.

4. The mount according to claim 1, wherein the base plate is selected from the group consisting of diallyl phthalate and a liquid crystal polymer.

5. The mount according to claim 1, wherein the plurality of leads permits defluxing fluid to flow underneath the base plate.

6. The mount according to claim 1, wherein the mount is configured to permit tuning of the high frequency transformer during assembly of the high frequency transformer to the mount.

7. The mount according to claim 1, wherein the base plate comprises an electrically insulating material having a dimensional deformation point temperature greater than 400° C.

8. A hybrid module comprising:

a substrate;

at least one component attached to the substrate;

a base plate having a first surface and a second surface, the first surface and the second surface opposite each other, and the first surface facing the at least one component;

leads extending from the base plate and coupled to the substrate, wherein the leads support the base plate over at least a portion of the at least one component; and an electrical conductor circumscribing one of the leads.

9. The hybrid module according to claim 8, wherein the base plate is selected from the group consisting of diallyl phthalate and a liquid crystal polymer.

10. The hybrid module according to claim 8, wherein the leads permit defluxing fluid to flow beneath the base plate.

11. A hybrid module comprising:

a substrate;

at least one component attached to the substrate;

a base plate having a first surface and a second surface, the first surface and the second surface opposite each other, and the first surface facing the at least one component;

leads extending from the base plate and coupled to the substrate, wherein the leads support the base plate over at least a portion of the at least one component; and at least one transformer mounted on the second surface of the base plate, the at least one transformer having wires wrapped around the leads to electrically couple the at least one transformer to the substrate.

12. The hybrid module according to claim 11, wherein the leads each have a first end extending from the base plate and a second end bent underneath the first surface of the base plate and coupled to the substrate.

13. The hybrid module according to claim 12, wherein the second end of each of the leads has a notch and wherein the wires of the at least one transformer are wrapped around the notch of the second end of each of the leads.

14. The hybrid module according to claim 8, wherein the base plate and the leads comprise an electrically insulating material.

* * * * *